(12) United States Patent
Horiuchi et al.

(10) Patent No.: US 10,374,414 B2
(45) Date of Patent: Aug. 6, 2019

(54) SEMICONDUCTOR POWER MODULE AND POWER CONVERSION APPARATUS USING THE SAME

(71) Applicant: HITACHI POWER SEMICONDUCTOR DEVICE, LTD., Hitachi-shi, Ibaraki (JP)

(72) Inventors: Keisuke Horiuchi, Tokyo (JP); Daisuke Kawase, Hitachi (JP); Masamitsu Inaba, Hitachi (JP); Katsuaki Saito, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 715 days.

(21) Appl. No.: 14/757,466

(22) Filed: Dec. 23, 2015

(65) Prior Publication Data

US 2016/0190915 A1 Jun. 30, 2016

(30) Foreign Application Priority Data

Dec. 24, 2014 (JP) .................................. 2014-259670

(51) Int. Cl.
*H02M 7/5387* (2007.01)
*H02H 7/122* (2006.01)
(Continued)

(52) U.S. Cl.
CPC ........... *H02H 7/122* (2013.01); *H01L 23/053* (2013.01); *H01L 23/49844* (2013.01);
(Continued)

(58) Field of Classification Search
CPC .......... H02M 7/00; H02M 7/003; H02M 7/48; H02M 7/53; H02M 7/537; H02M 7/5387;
(Continued)

(56) References Cited

U.S. PATENT DOCUMENTS

2007/0290305 A1 12/2007 Oyama et al.
2010/0097765 A1* 4/2010 Suzuki .................. B60K 6/365
361/699
(Continued)

FOREIGN PATENT DOCUMENTS

JP 2003-303939 A 10/2003
JP 2004-221366 A 8/2004
(Continued)

OTHER PUBLICATIONS

Extended European Search Report for corresponding European Application No. 15003635.8 dated Jun. 7, 2016.

*Primary Examiner* — Gary L Laxton
*Assistant Examiner* — Carlos O Rivera-Perez
(74) *Attorney, Agent, or Firm* — Miles & Stockbridge PC

(57) ABSTRACT

A semiconductor power module with which it is possible to suppress the influence of noise given from a main terminal to a control terminal is provided. At least any one of main terminals (positive electrode terminal, negative electrode terminal, alternating current terminal) is so configured that the main terminal includes two parts extended in a common direction. The two parts are, for example, formed of a single component having such as a shape that the component is bifurcated from the outside toward the inside of the semiconductor power module or two different components. The two parts are so structured that the parts are extended in a common direction. Control terminals (gate signal terminal and emitter signal terminal) are so arranged that a laminated portion of the control terminals is sandwiched between one and the other of the two parts to configure the semiconductor power module.

8 Claims, 16 Drawing Sheets

(51) Int. Cl.
  *H01L 29/739* (2006.01)
  *H01L 23/498* (2006.01)
  *H01L 23/053* (2006.01)
  *H01L 25/07* (2006.01)
  *H01L 23/64* (2006.01)
  *H01L 25/18* (2006.01)
  *H02M 7/00* (2006.01)
  *H02M 1/00* (2006.01)

(52) U.S. Cl.
  CPC .......... *H01L 23/645* (2013.01); *H01L 25/072* (2013.01); *H01L 29/7393* (2013.01); *H01L 25/18* (2013.01); *H01L 2924/0002* (2013.01); *H02M 7/003* (2013.01); *H02M 7/5387* (2013.01); *H02M 2001/0038* (2013.01)

(58) Field of Classification Search
  CPC ........... H02M 7/53871; H02M 7/5388; H02M 2001/0038; H02H 7/122; H01L 23/49844; H01L 23/053; H01L 23/645; H01L 23/072; H01L 23/18; H01L 23/49544; H01L 25/072; H01L 25/18; H01L 29/7393; H01L 2924/0002

USPC ......... 363/15–17, 40–43, 65, 71, 72, 95–99, 363/123, 131–139, 144–147; 257/678, 257/690, 691, 773–777, E23.01, E23.003, 257/E23.004, E23.104
  See application file for complete search history.

(56) References Cited

U.S. PATENT DOCUMENTS

| | | |
|---|---|---|
| 2010/0176505 A1 | 7/2010 | Oyama et al. |
| 2011/0051371 A1 | 3/2011 | Azuma et al. |
| 2011/0310585 A1 | 12/2011 | Suwa et al. |
| 2012/0256194 A1 | 10/2012 | Yoshihara et al. |
| 2014/0016387 A1 | 1/2014 | Nishikimi et al. |
| 2014/0167235 A1 | 6/2014 | Horie |

FOREIGN PATENT DOCUMENTS

| | | |
|---|---|---|
| JP | 4365388 | 11/2009 |
| JP | 2014-120734 A | 6/2014 |
| WO | WO 2010/131679 A1 | 11/2010 |

* cited by examiner

ENLARGED VIEW OF β PORTION

SEMICONDUCTOR POWER MODULE AND POWER CONVERSION APPARATUS USING THE SAME

CLAIM OF PRIORITY

The present application claims priority from Japanese application serial no. 2014-259670, filed on Dec. 24, 2014, the content of which is hereby incorporated by reference into this application.

BACKGROUND OF THE INVENTION

Field of the Invention

The present invention relates to a semiconductor power module mounted with a power semiconductor device such as an insulated gate bipolar transistor (hereafter, referred to as IGBT) and a power conversion apparatus mounted with the same.

Description of Prior Art

In recent years, electric railroad vehicles and electric vehicles have gained the spotlight from the viewpoint of friendliness to the environment. These electrically driven mobile bodies are mounted with a power conversion apparatus (inverter, converter, chopper) and a motor and semiconductor power modules are generally used for the power conversion apparatuses. The power module converts direct-current power into alternating-current power or an alternating current into a direct current by switching a power semiconductor device such as IGBT.

In power modules, generally, a set of a switching element and a diode connected in parallel is used (This set is designated as an arm). A set of the semiconductors connected between a positive electrode terminal and an alternating current terminal is called upper arm; a set connected between an alternating current terminal and a negative electrode terminal is called lower arm. One-phase alternating-current power can be outputted by combining an upper arm and a lower arm. Therefore, to generate a three-phase alternating current, three sets of upper and lower arms (six arms in total) are necessary.

Patent Documents 1 to 5 disclose a power module mounted with two arms of power semiconductor devices housed in a single case (hereafter, referred to as 2-in-1 module) and a power module mounted with six arms power semiconductor devices housed in a single case (hereafter, referred to as 6-in-1 module).

The power module described in Patent Document 1 (Japanese Patent Application Laid-Open No. 2014-120734) is an example of 2-in-1 module and is a semiconductor module mounted with two IGBTs and two freewheel diodes and includes an external lead terminal and auxiliary terminals (gate auxiliary terminal and emitter auxiliary terminal). In the semiconductor module in Patent Document 1, the structures around the auxiliary terminals are made characteristic to ensure ease of assembly and prevent stress transmission during assembly.

The power module described in Patent Document 2 (International Publication No. 2010/131679) is a typical example of 2-in-1 module and a positive electrode terminal and a negative electrode terminal are placed close to each other for inductance reduction.

In the power module described in Patent Document 3 (Japanese Patent Application Laid-Open No. 2003-303939), the case of the power module is provided with a protrusion to ensure an insulation distance and thereby achieve size reduction.

In the power module described in Patent Document 4 (Japanese Patent Application Laid-Open No. 2004-221366), a pin header is adopted for auxiliary terminals to obtain a vibration-resistant module.

The power module described in Patent Document 5 (Japanese Patent No. 4365388) is characterized in that a printed board is made easy to deform to relax stress from a silicone gel in the module.

As mentioned above, the power module described in Patent Document 1 is an example of 2-in-1 module and is mounted with two IGBTs and two freewheel diodes and includes an external lead terminal and auxiliary terminals (gate auxiliary terminal and emitter auxiliary terminal). The structures around the auxiliary terminals are made characteristic to ensure ease of assembly and prevent stress transmission during assembly. However, the power module in the document does not take module size reduction into account at all. For this reason, when the module is reduced in size, a main terminal and an auxiliary terminal are brought closer to each other. No consideration is given to that owing to this structure a magnetic flux generated by variation in the large current of a main terminal is prone to has more noticeable influence on an auxiliary terminal in terms of noise. Actually, FIGS. 3 to 5 in the document show only configurations in which an auxiliary terminal 25 is provided at the outer edge of the module farthest from an external lead terminal 24. Also according to this, it is understood that: the power module in the document is not intended for module size reduction; therefore, there is no motivation in the document for suppression of the influence of noise due to an approximation of the external lead terminal 24 and the auxiliary terminal 25.

As mentioned above, the power module described in Patent Document 2 is a typical example of 2-in-1 module and a positive electrode terminal and a negative electrode terminal are placed close to each other for inductance reduction. However, as the result of pursuing size reduction, main terminals (positive electrode terminal, negative electrode terminal, alternating current terminal) and a control terminal are orthogonal to each other. Because of this layout, it is understood that no consideration is given to that a magnetic flux is generated by variation in the large current of a main terminal and a control terminal is influenced by this noise.

As mentioned above, in the power module described in Patent Document 3, the case of the power module is provided with a protrusion to ensure an insulation distance and thereby achieve size reduction. However, since this protrusion interferes with a wiring route external to the module, it is difficult to reduce inductance. As the result of pursuing size reduction, no consideration is given to that a control terminal is influenced by noise due to a magnetic flux induced by variation in the large current of a main terminal. This poses a problem that malfunction may be caused depending on the arrangement of control terminals.

As mentioned above, in the power module described in Patent Document 4, a pin header is adopted for auxiliary terminals to obtain a vibration-resistant module. However, the document does not take module size reduction into account.

As mentioned above, the power module in Patent Document 5 is characterized in that a printed board is made easy to deform to relax stress from a silicone gel in the module. This invention also gives no consideration to module size reduction.

For electric railroad vehicles, it is necessary to install a power conversion apparatus in a limited space under the floor of an electric car, together with other apparatuses. For electric vehicles, it is necessary to install a power conversion apparatus in a limited space under the engine hood, together with other apparatuses. For this reason, module size reduction is an important challenge. Meanwhile, it is necessary to sufficiently consider the influence of noise on a control terminal which will become too considerable to ignore as the result of pursuing size reduction. This noise is caused by a magnetic flux generated by variation in the large current of a main terminal. That is, it is required to assume a possibility of malfunction depending on the arrangement of control terminals. An example will be taken. When the current of a main terminal varies at the time of turn-off, a magnetic flux crossing the loop of a current flowing from a gate signal terminal to an emitter signal terminal through IGBT dissipates. At this time, an eddy current is produced in the signal wire loop in such a direction that the magnetic flux is maintained according to Lentz's law. It is required to assume that this will cause a problem such as unintended gate signal on and an erroneous detection of an emitter signal. However, since no special consideration has been given to module size reduction up to now, as mentioned above, a module structure which makes it possible to suppress the influence of noise from a main terminal to a control terminal and achieve module size reduction has not been provided.

SUMMARY OF THE INVENTION

Thus, with respect to semiconductor power modules, it is a challenge to provide a module structure which makes it possible to suppress the influence of noise given from a main terminal to a control terminal and achieve module size reduction.

To address the above problem, a semiconductor power module of the present invention is, for example, a semiconductor power module including a positive electrode terminal, a negative electrode terminal, an alternating current terminal, an emitter signal terminal, and a gate signal terminal. Of the positive electrode terminal, negative electrode terminal, and alternating current terminal, at least any one includes two parts extended in a common direction. The emitter signal terminal and the gate signal terminal have a laminated portion formed by laminating their respective parts. The laminated portion is so placed as to be sandwiched between one and the other of the two parts of the any one of the positive electrode terminal, negative electrode terminal, and alternating current terminal.

A power conversion apparatus of the present invention is, for example, a power conversion apparatus formed by arranging semiconductor power modules having a substantially rectangular shape in parallel in the direction of the shorts sides of the rectangle. The semiconductor power modules are semiconductor power modules of the present invention.

According to an aspect of the present invention, it is possible to provide a module structure which makes it possible to suppress the influence of noise given from a main terminal to a control terminal in a semiconductor power module and achieve module size reduction.

DETAILED DESCRIPTION OF THE PREFERRED EMBODIMENTS

Figure 1:
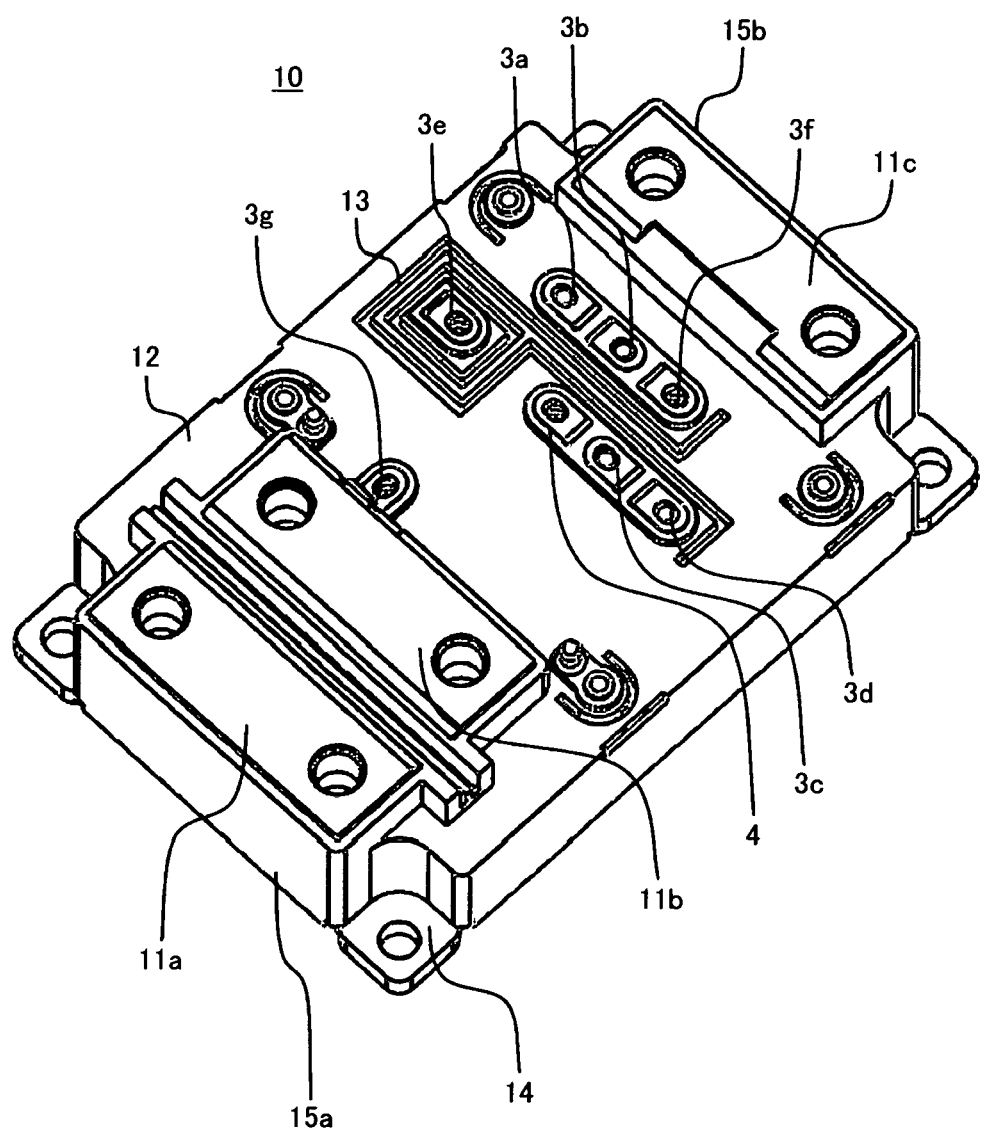
FIG. 1 is an external perspective view illustrating a semiconductor power module in Example 1 of a first embodiment of the present invention.

A semiconductor power module of the present invention is characterized, for example, in that: at least any one of main terminals (positive electrode terminal, negative electrode terminal, alternating current terminal) includes two parts extended in a common direction; and control terminals (gate signal terminal and emitter signal terminal) are so formed that their laminated portion is sandwiched between one and the other of the two parts.

It is preferable that the "two parts" are formed of a single component bifurcated from the outside toward the inside of the semiconductor power module or two different components. In either case, one and the other of the "two parts" are extended in a common direction.

In the former case, for example, the semiconductor power module of the present invention has such a structure that: each main terminal (positive electrode terminal, negative electrode terminal, alternating current terminal) is branched into two from the outside toward the inside of the semiconductor power module; and one and the other of the two branched parts are extended in a common direction. The control terminals (emitter signal terminal and gate signal terminal) are so placed as to be sandwiched between the bifurcated main terminals.

The semiconductor power module configured as mentioned above may be so formed that the alternating current terminal is placed on a surface on the side opposite a surface where the positive electrode terminal and the negative electrode terminal are placed.

The semiconductor power module configured as mentioned above may be so formed that the control terminals may be placed between an area where the positive electrode terminal and the negative electrode terminal are placed and an area where the alternating current terminal is placed.

The semiconductor power module configured as mentioned above may be so formed that: the module is further provided with a base (module base) on which the positive electrode terminal, negative electrode terminal, alternating current terminal, emitter signal terminal, and gate signal terminal are mounted together; and the base, a gate signal wiring, and an emitter signal wiring are so placed that the direction of the base plane and the loop of the gate signal wiring and emitter signal wiring laminated together are orthogonal to each other.

The semiconductor power module configured as mentioned above may be so formed that: an insulator is placed in at least either of between the positive electrode terminal and negative electrode terminal laminated together and between the emitter signal wiring and the gate signal wiring.

The control terminals are provided with a laminated structure formed by laminating the emitter signal terminal and the gate signal terminal. A region where main terminals and control terminals adjoin to each other (area where the control terminals are sandwiched between the main terminals) is preferably so configured that: the emitter signal terminal and the gate signal terminal are laminated in a direction perpendicular to the base (module base).

In a semiconductor power module of the present invention, control terminals (emitter signal terminal and gate signal terminal) are, for example, so placed as to be sandwiched between one and the other of bifurcated main terminals. This facilitates dense packaging and enables module size reduction. In this case, magnetic fluxes generated by the individual bifurcated main terminals are canceled out and minimized substantially at the intermediate point between the one and the other of the bifurcation. This makes it possible to suppress noise from a main terminal to a control terminal and achieve dense packaging. In addition, the emitter signal terminal and the gate signal terminal are laminated in a direction perpendicular to the module base. This makes it possible to make the following directions orthogonal to each other: the direction of magnetic fluxes generated by the perpendicularly bifurcated main terminals and the direction of magnetic fluxes penetrating the signal wire loops. The influence of noise is minimized. As a result, troubles of malfunction at the time of turn-on or turn-off are suppressed.

A power conversion apparatus of the present invention is, for example, a power conversion apparatus formed by arranging semiconductor power modules having a substantially rectangular shape in parallel in the direction of the short sides of the rectangle. The semiconductor power modules are any of the semiconductor power modules of the present invention.

The power conversion apparatus configured as mentioned above may be so formed that: a capacitor module is placed on the positive electrode terminal side or negative electrode terminal side of semiconductor power modules and a gate wiring circuit board is provided directly above the semiconductor power modules.

Hereafter, a detailed description will be given to embodiments of the present invention using each Example with reference to the drawings Example 1

FIG. 1 shows an external perspective view of a semiconductor power module 10 in Example 1 of a first embodiment of the present invention. The semiconductor power module 10 in this example is, for example, so formed that at least any one of main terminals (positive electrode terminal 11a, negative electrode terminal 11b, alternating current terminal 11c) includes two parts extended in a common direction. Control terminals (gate signal terminal 3a(3c) and emitter signal terminal 3b(3d)) are so placed that their laminated portion is sandwiched between one and the other of the two parts. Especially, the "two parts" are formed of a single component having such a shape that the component is bifurcated from the outside toward the inside of the semiconductor power module 10. The one and the other of the "two parts" are extended in a common direction.

As illustrated in FIG. 1, the main terminals (positive electrode terminal 11a, negative electrode terminal 11b, alternating current terminal 11c) through which a large current flows and signal terminals (upper arm gate signal wire 3a, lower arm gate signal wire 3c, temperature detection signal wire 4, upper arm emitter signal wire 3b, lower arm emitter signal wire 3d, upper arm collector signal wire 3e, lower arm collector signal wire 3f, a negative electrode signal terminal 3g) for weak currents are separated from each other; and predetermined insulation distances (air clearance and creepage distance) are ensured between the main terminals and the signal terminals by a groove 13 provided in a module case 12. The module case 12 is bonded to a base 14 and the module is mounted therein with semiconductor devices 2a, 2b, 2c, and 2d.

In this example, the alternating current terminal 11c is placed on a surface 15b opposite a surface 15a where the positive electrode terminal 11a and the negative electrode terminal 11b are placed. This makes it possible to place all the control terminals 3a, 3b, 3c, 3d, 3e, 3f, and 3g together in the center of the module and to bond a driver circuit board 131 mounted with a driver circuit 130 directly to the module. The control terminals 3a to 3g may be of a screw type, as illustrated in the drawing or may be of a plug-in type such as a fastening terminal and a press-fit terminal.

Figure 7:
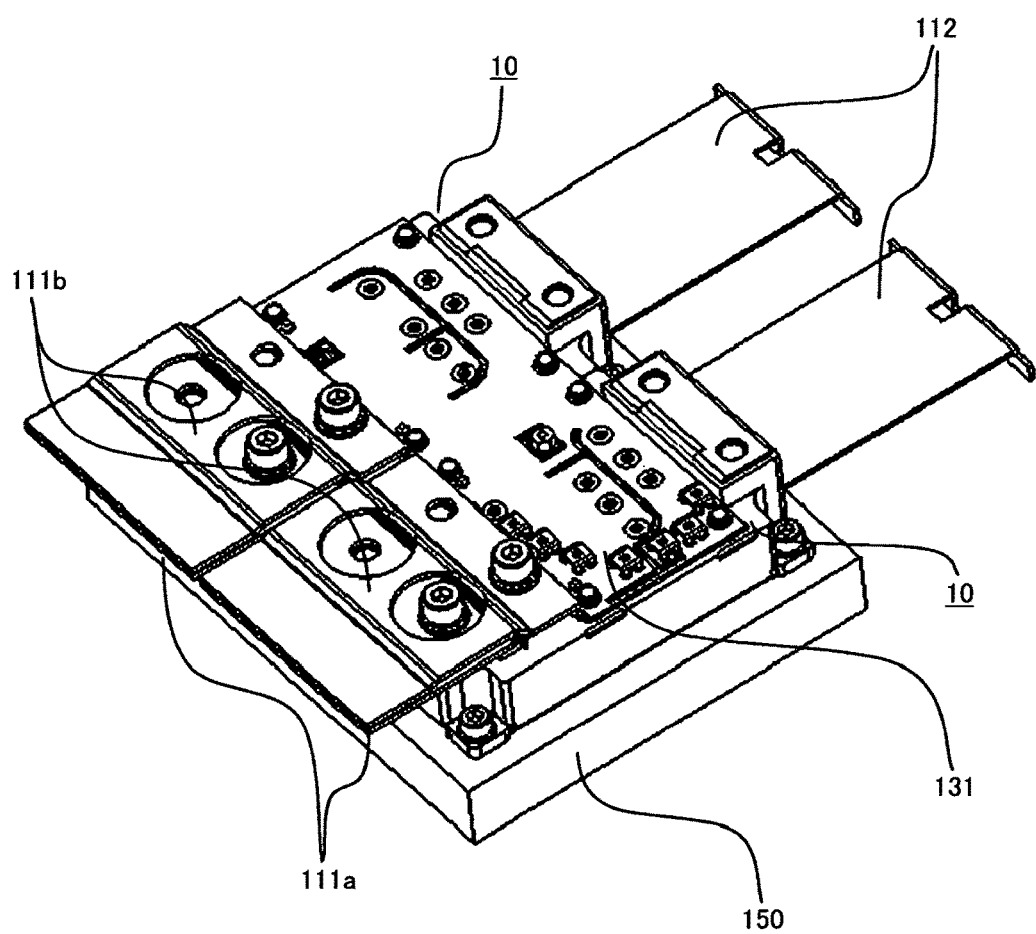
FIG. 7 is a perspective view of a power conversion apparatus formed by mounting semiconductor power modules of the present invention with a capacitor bus bar, a gate drive circuit board, and an output bus bar.

Even when multiple semiconductor power modules 10 are placed in parallel as illustrated in, for example, FIG. 7, the driver circuit board 131 can be placed astride the upper faces of the semiconductor power modules. This makes it possible to shorten the wiring length between the driver circuit board 131 and the semiconductor power modules 10 and integrate driver circuit boards into one. As a result, the gate-to-emitter loop inductance can be reduced. As illustrated in FIG. 1, the semiconductor power module 10 is substantially rectangular and the positive electrode terminal 11a, negative electrode terminal 11b, and alternating current terminal 11c are provided on the short side. The groove 13 is so provided that an insulation distance can be ensured even when the clearance between adjoining modules is small. As a result, multiple semiconductor power modules 10 can be placed adjacently and size reduction can be achieved even when multiple power modules 10 are combined.

In FIG. 1, a capacitor module 120 is placed on the side of the surface 15a where the direct current terminals (positive electrode terminal 11a and negative electrode terminal 11b) are placed. For this reason, it is possible to shorten the wiring length between the capacitor module 120 and the semiconductor power module 10. Consequently, the inductance between the positive electrode terminal 11a and the negative electrode terminal 11b can be reduced.

Figure 2:
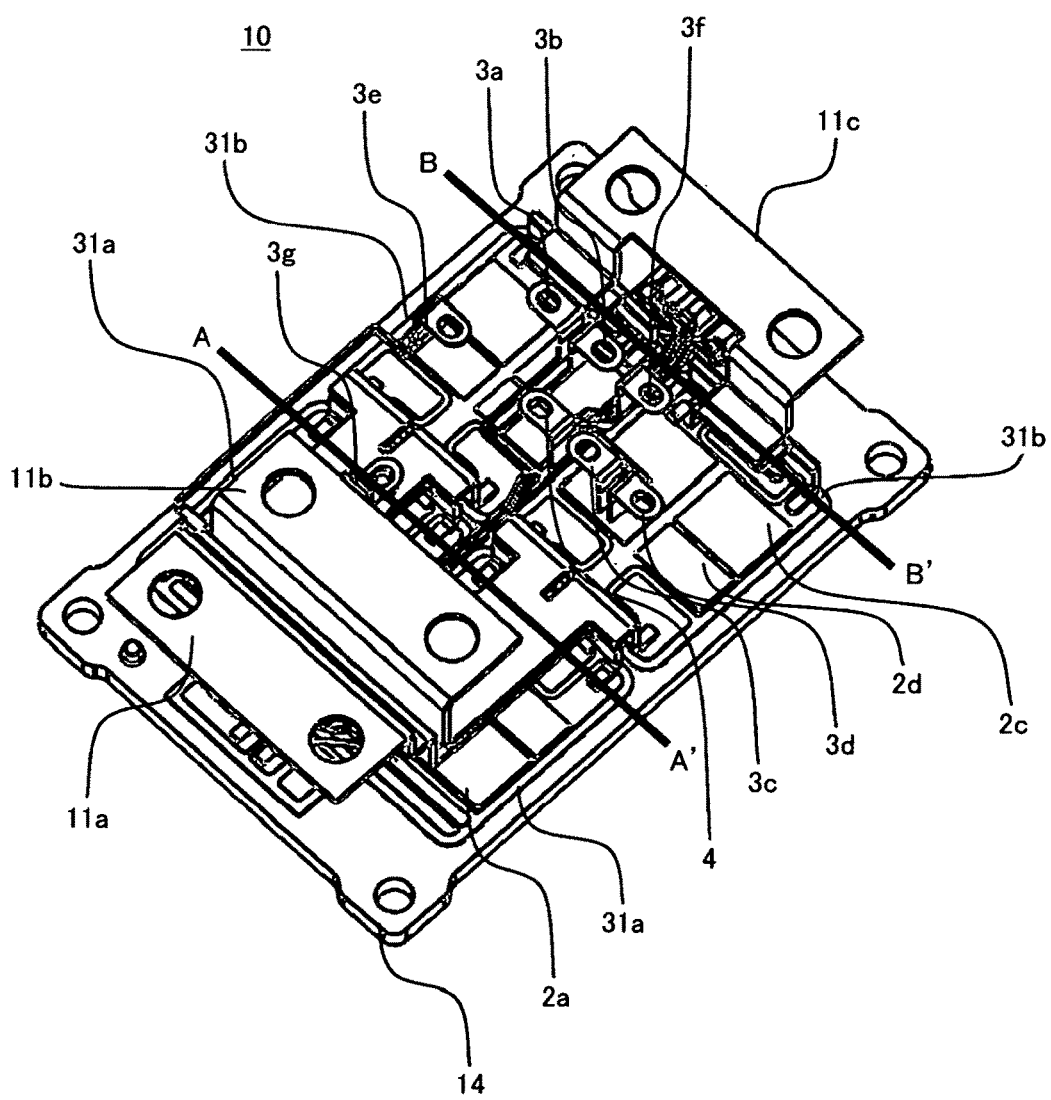
FIG. 2 is a perspective view illustrating the case internal structure of the semiconductor power module in FIG. 1.
Figure 3:
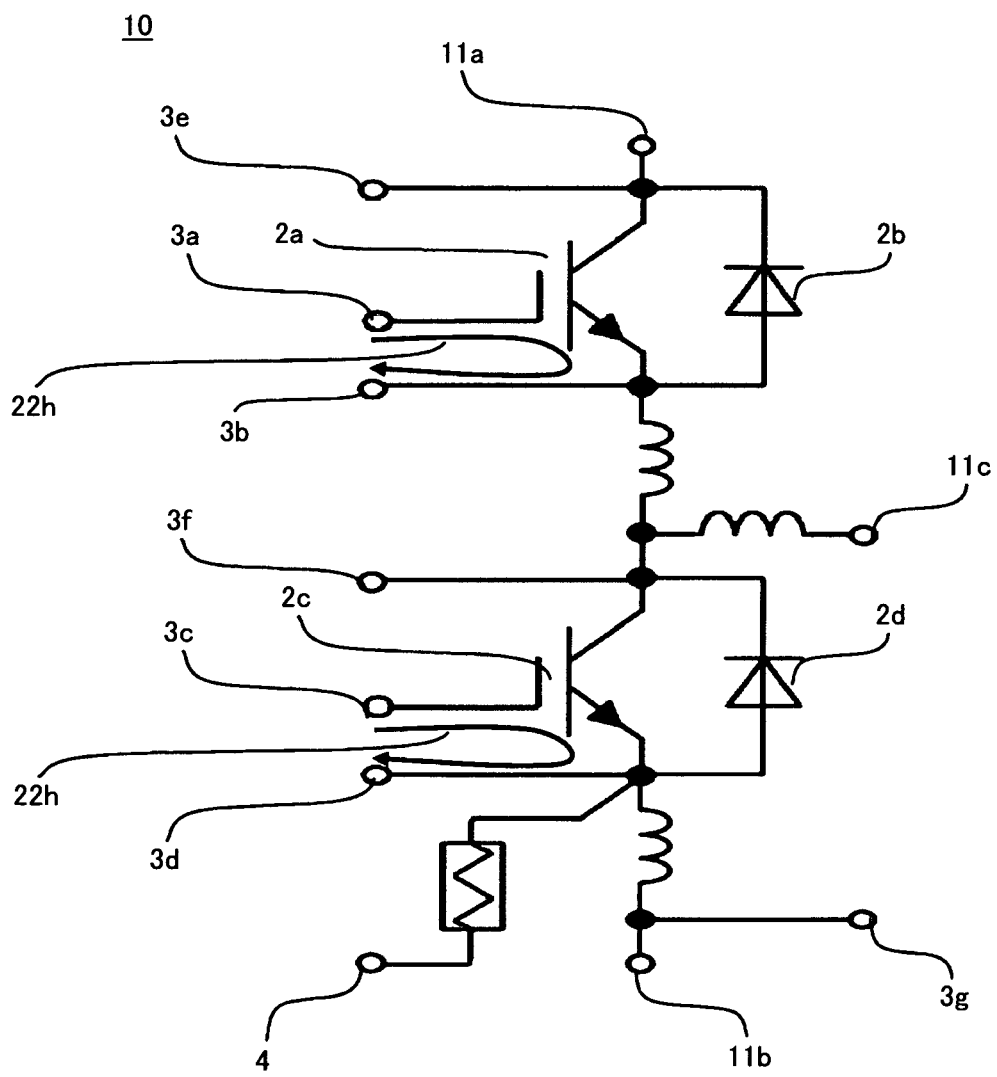
FIG. 3 is an equivalent circuit diagram of a semiconductor power module in Example 1 of the first embodiment of the present invention.
Figure 4:
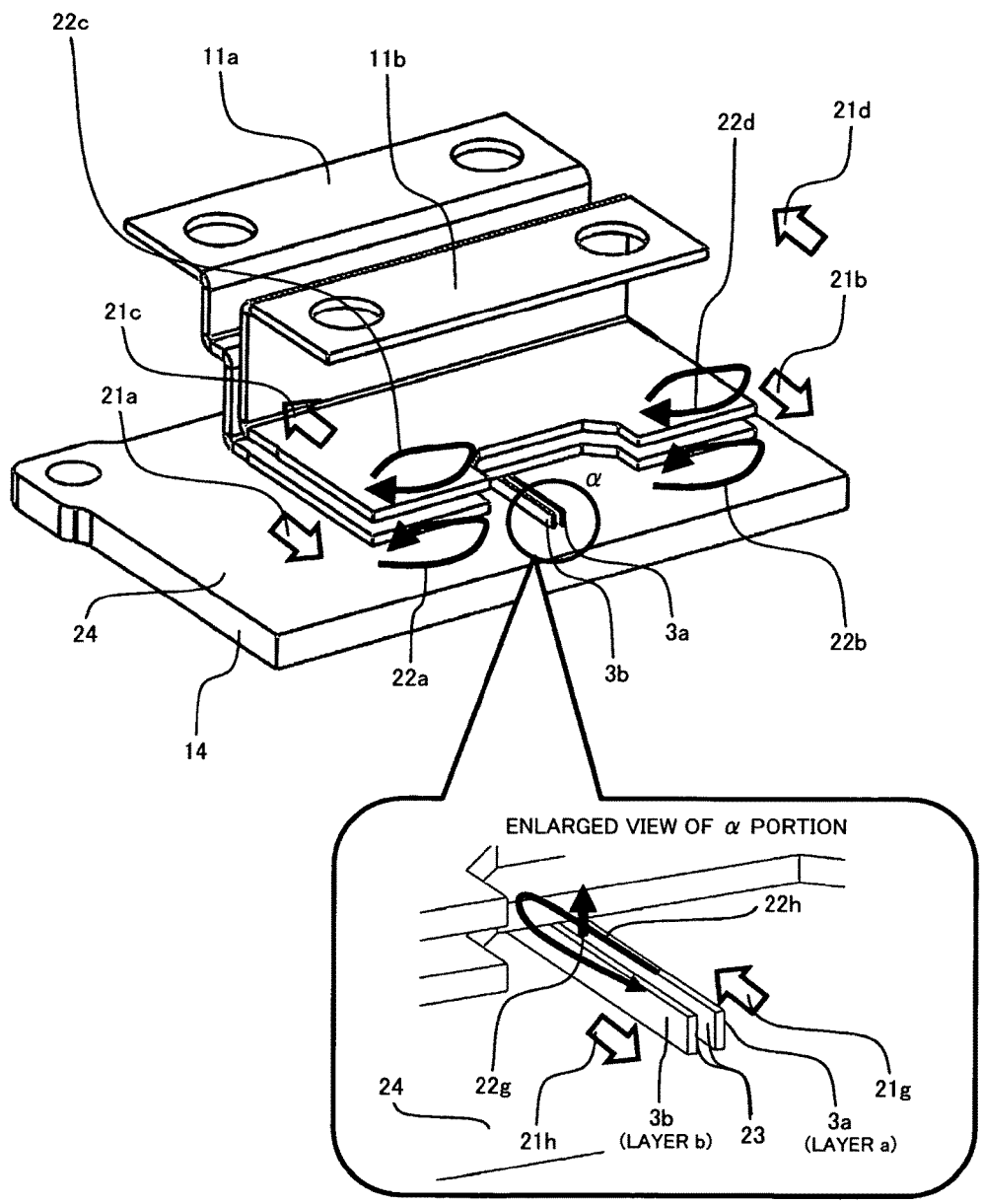
FIG. 4 is a perspective view illustrating main terminals and control terminals in a section taken along line A-A' of FIG. 2.
Figure 5:
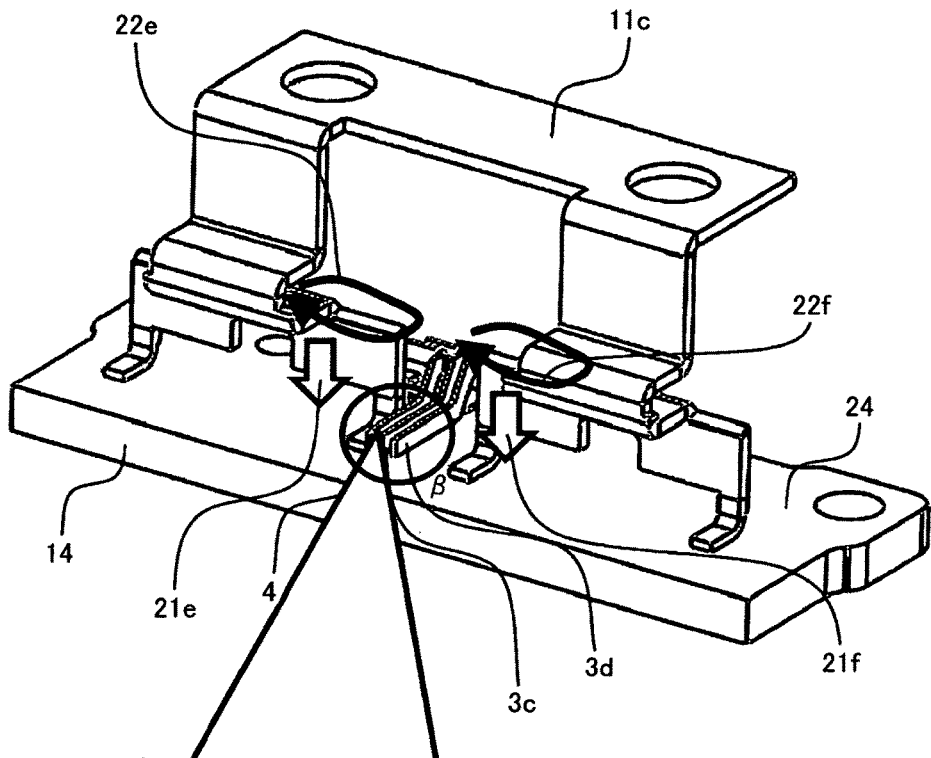
FIG. 5 is a perspective view illustrating a main terminal and control terminals in a section taken along line B-B' of FIG. 2.
Figure 5:
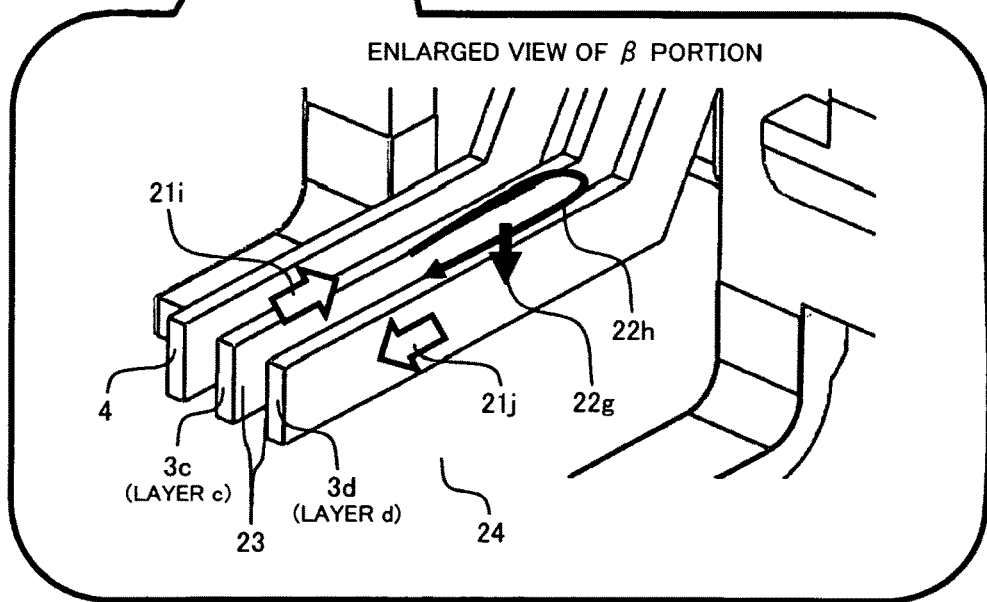
Figure 6:
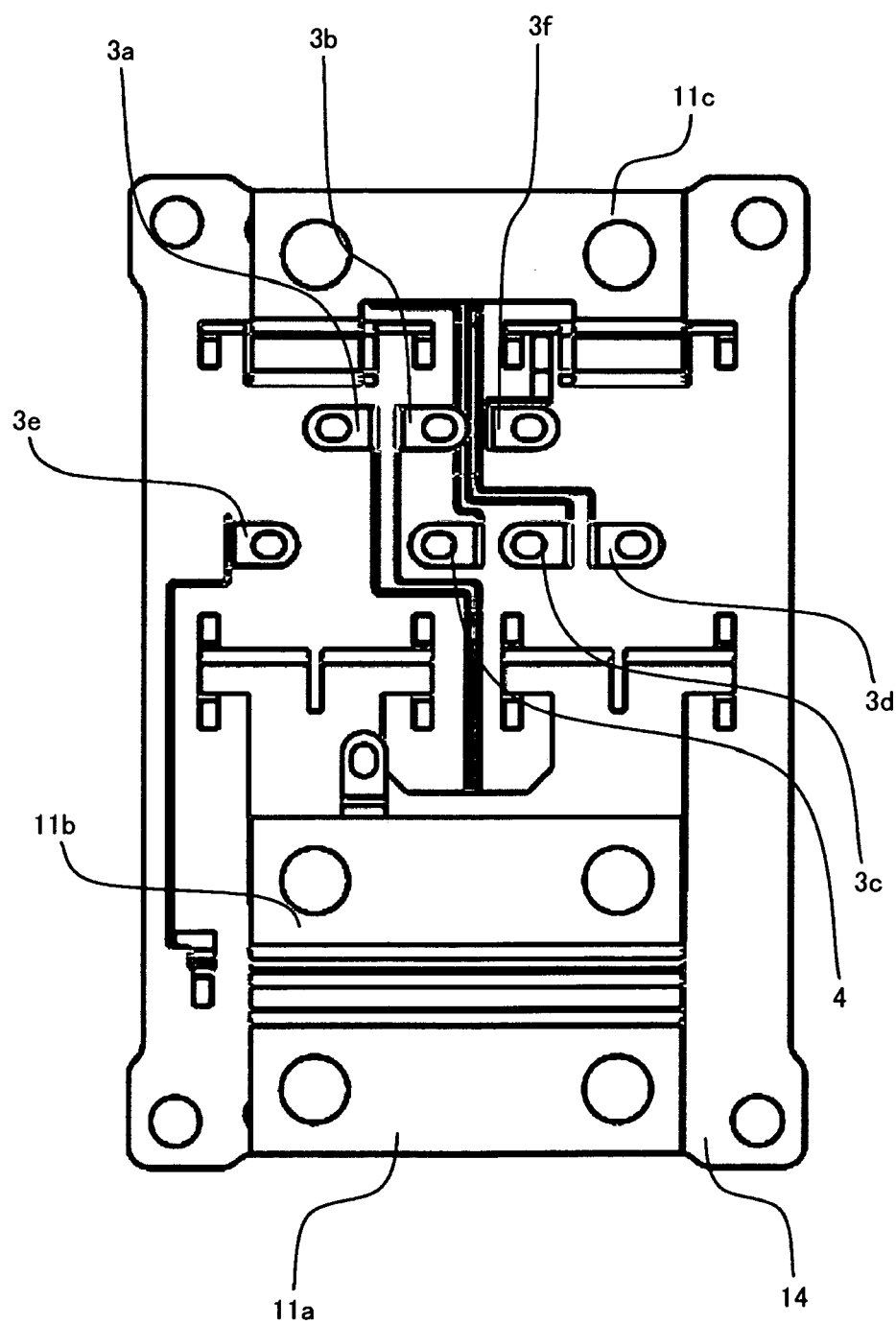
FIG. 6 is a top view of the case internal structure in FIG. 2 as viewed squarely from above.

FIG. 2 illustrates the case internal structure of the semiconductor power module in FIG. 1; FIG. 3 is an equivalent circuit diagram of the semiconductor power module in FIG. 1; FIG. 4 is a perspective view illustrating main terminals and control terminals in a section taken along line A-A' of FIG. 2; FIG. 5 is a perspective view illustrating a main terminal and control terminals in a section taken along line B-B' of FIG. 2; and FIG. 6 is a top view of the case internal structure in FIG. 2 as viewed squarely from above.

First, a description will be given to the configuration of the case internal structure in FIG. 2 with reference to FIG. 2 and FIG. 6.

A description will be given to an equivalent circuit corresponding to the case internal structure in FIG. 2. FIG. 3 is an equivalent circuit diagram of the semiconductor module in FIG. 1. As mentioned above, the semiconductor power module 10 in FIG. 1 belongs to a type called 2-in-1 power module; and the circuit in FIG. 3 which is a circuit equivalent thereto corresponds to each of the upper and lower arm series circuits 1a, 1b, 1c in the power conversion apparatus in FIG. 16 described later.

A description will be given to a circuit operation-like action brought about by the case internal structure in FIG. 2 with reference to FIG. 4. First, a consideration will be given to the directions 21a and 21b of respective currents of a positive electrode left terminal and a positive electrode right terminal flowing through the positive electrode terminal 11a when an upper arm IGBT 2a is turned on. Then a magnetic flux is induced in the direction of a right handed screw with the directions 21a and 21b of currents taken as a central axis according to Ampere's law. There are two directions of magnetic flux: the direction 22a of a magnetic flux in proximity to the bifurcated positive electrode left terminal; and the direction 22b of a magnetic flux in proximity to the positive electrode right terminal. The magnetic fluxes are cancelled out in proximity to the center of the bifurcation. Similarly, a consideration will be given to the directions 21c and 21d of respective currents of a negative electrode left terminal and a negative electrode right terminal flowing through the negative electrode terminal 11b. Also with respect to the negative electrode terminal 11b, a magnetic flux is induced in the direction of a right handed screw with the directions 21c and 21d of currents taken as a central axis. There are two directions of magnetic flux: the direction 22c of a magnetic flux in proximity to the bifurcated negative electrode left terminal; and the direction 22d of a magnetic flux in proximity to the negative electrode right terminal. These magnetic fluxes are also cancelled out in proximity to the center of the bifurcation. The direction 21a of the current of the left terminal of the positive electrode terminal 11a and the direction 21c of the current of the left terminal of the negative electrode terminal 11b are opposite to each other; therefore, the direction 22a of the magnetic flux inducted by the positive electrode left terminal and the direction 22c of the magnetic flux induced by the negative electrode left terminal are opposite to each other. The direction 21b of the current of the right terminal of the positive electrode terminal 11a and the direction 21d of the current of the right terminal of the negative electrode terminal 11b are opposite to each other; therefore, the direction 22b of the magnetic flux induced by the positive electrode right terminal and the direction 22d of the magnetic flux induced by the negative electrode right terminal are opposite to each other. For this reason, making the positive electrode terminal and the negative electrode terminal adjacent to each other cancels out their respective magnetic fluxes. At the time of turn-off, a current is prone to flow to the direction of an eddy current flowing to maintain an originally existing magnetic flux according to Lentz's law. However, the influence of a magnetic flux as a noise source on a control terminal can be reduced by providing the control terminal between one (left terminal) and the other (right terminal) of the bifurcated main terminal (in proximity to the center of the bifurcation). Further, the gate signal terminal 3a (layer a) and the emitter signal terminal 3b (layer b) are laminated in a direction perpendicular to the module base 14, that is, the layer b is laminated beside the layer a. As a result, it is possible to make the following directions orthogonal to each other: the direction of a magnetic flux generated by the perpendicularly bifurcated main terminal and the direction (22g) of a magnetic flux penetrating the signal wire loop (22h). Consequently, the influence of noise is minimized. The magnetic flux (22g) penetrating the signal wire loop formed by the upper arm gate signal terminal (3a) and the upper arm emitter signal terminal (3b) becomes a magnetic flux which causes noise. An arrangement is made so that the opposite planes (23) of the gate signal terminal and the emitter signal terminal made adjacent to each other are orthogonal to the base plane (24). As a result, it is possible to further reduce the influence of the magnetic fluxes of the main terminals involving less magnetic flux as a vertical component. Consequently, troubles of malfunction at the time of upper arm turn-on are suppressed. To consider action at the time of upper arm turn-off, the above-mentioned directions of currents and magnetic fluxes can be inverted. Therefore, it is understood that the same effect as at the time of upper arm turn-on is brought about.

The above description also applies to the lower arms. This will be described with reference to FIG. 5. First, a consideration will be given to the following directions of currents: the direction 21e of a current flowing through the left terminal of the alternating current terminal 11c when a lower arm IGBT 2c is turned on; and the direction 21f of a current flowing through the right terminal of the alternating current terminal 11c at the same time. Then a magnetic flux 22e is induced in the direction of a right handed screw with the direction 21e of the current taken as a central axis according to Ampere's law; and a magnetic flux 22f is induced in the direction of a right handed screw with the direction 21f of the current taken as a central axis according to the same law. The direction of a magnetic flux penetrating the gate-to-emitter loop of the lower arm positioned in the center is perpendicular to the base plane. However, the magnetic flux 22e and magnetic flux 22f of the bifurcated alternating current terminal 11c cancel out each other and as a result the influence of the magnetic fluxes on control terminals is reduced.

It is preferable to sandwich an insulator (resin, paper, or the like), not shown, between the following terminals to arrange the terminal relative to each other: between the positive electrode terminal 11a and negative electrode terminal 11b laminated together; and between the emitter signal terminal 3b(3d) and the gate signal terminal 3a(3c). This makes it possible to reduce the size of laminated current loops and thus more effectively suppress the occurrence of penetration of magnetic fluxes.

Figure 16:
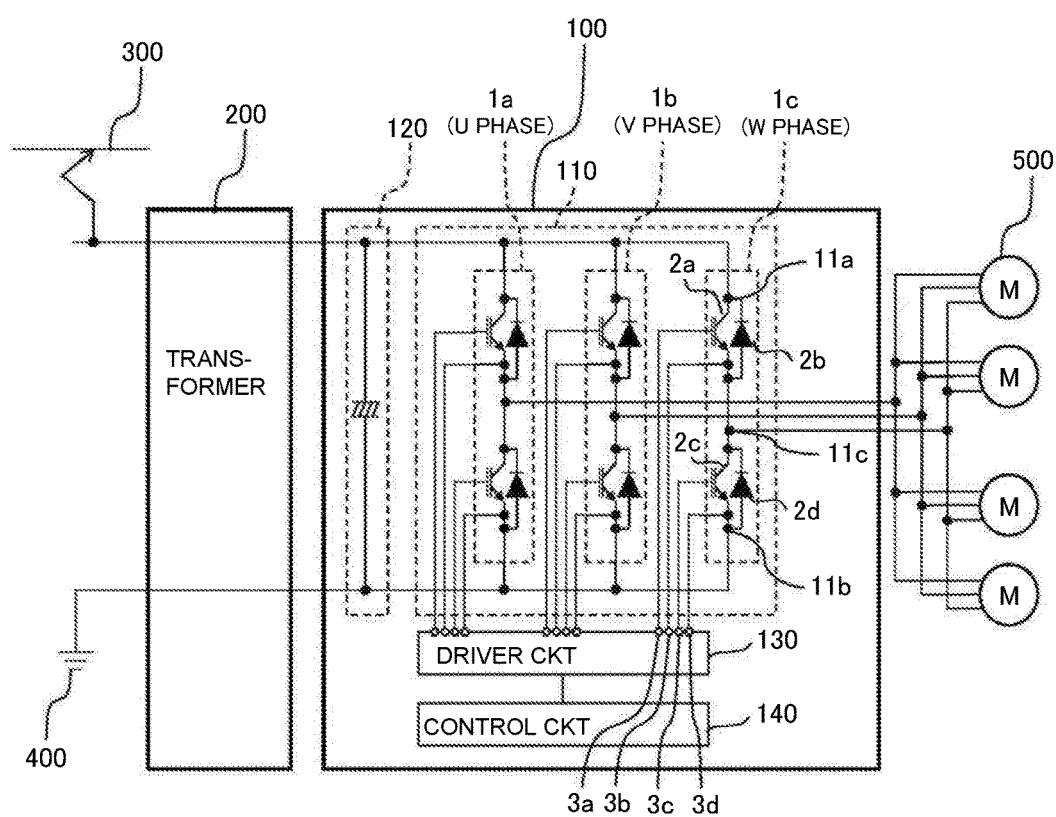
FIG. 16 is a circuit block diagram of a power conversion apparatus formed by mounting semiconductor power modules of the present invention in Example 4 of the present invention.

FIG. 7 is an assembly drawing illustrating how various members are mounted on the semiconductor power module 10 shown in FIG. 3 as an equivalent circuit. As shown in FIG. 16, direct current bus bars 111*a* and 111*b* are mounted between the positive electrode terminal 11*a* and the negative electrode terminal 11*b* for connecting a capacitor module 120; alternating current bus bars 112 are mounted for connecting an induction motor 500 to the alternating current terminal 11*c*; and the driver circuit board 131 is mounted over the module. The semiconductor power modules 10 are mounted on a heat sink 150 for heat dissipation. The negative electrode signal terminal 3*g* is placed away from the direct current bus bars 111. This makes the signal wire loop (22*h*) less susceptible to the influence of a magnetic flux caused by a large current flowing through a bus bar. In this drawing, two semiconductor modules 10 are arranged in parallel. This makes it possible to double an output current. Mounting a single driver circuit board astride two modules not only allows the driver circuit board 131 to communicate signal information with a control circuit board 141 through control terminals 3, but it produces a space for implementing an additional function such as an avalanche diode for overvoltage protection. Even when multiple power modules 10 are arranged in parallel as illustrated in FIG. 7, the driver circuit board 131 can be placed astride the upper faces of the modules. This makes it possible to shorten the wiring length between the driver circuit board 131 and the power modules 10 and integrate driver circuit boards into one. Thus gate-to-emitter loop inductance can be reduced.

Example 2

Figure 8:
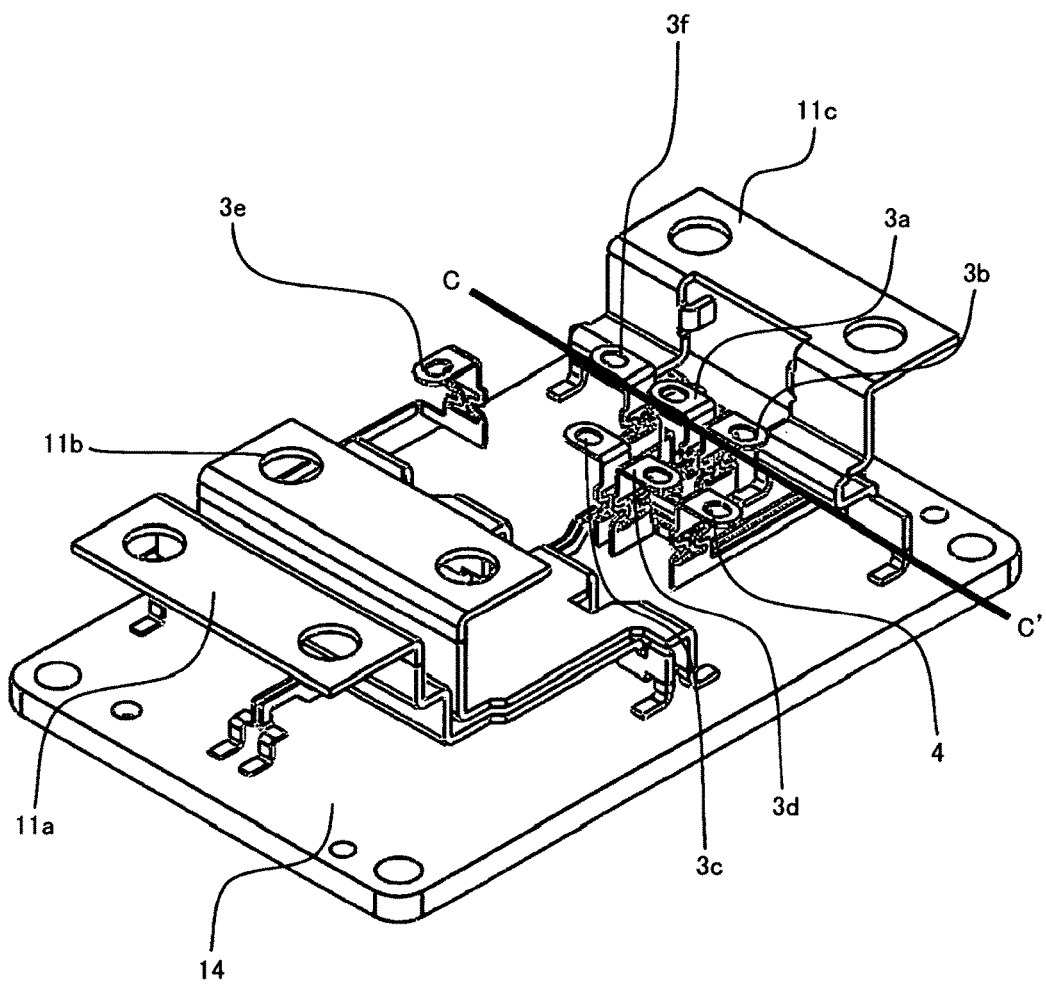
FIG. 8 is a perspective view illustrating the case internal structure of a semiconductor power module in Example 2 of a second embodiment of the present invention.

FIG. 8 is a perspective view illustrating the case internal structure of a semiconductor power module in Example 2 of a second embodiment of the present invention. This example is a modification to Example 1 and identical with Example 1 except that the layout of the main terminals and the control terminals is different from the layout in Example 1. That is, in the embodiment illustrated in FIG. 8, the control terminals (lower arm emitter signal terminal 3*d*, lower arm gate signal terminal 3*c*, temperature detection terminal 4), which are wired from the alternating current terminal side in Example 1 illustrated in FIGS. 1 to 6, are not wired in the center of the module. Instead, the control terminals are wired from between one of two bifurcated alternating current terminal sections.

Figure 9:
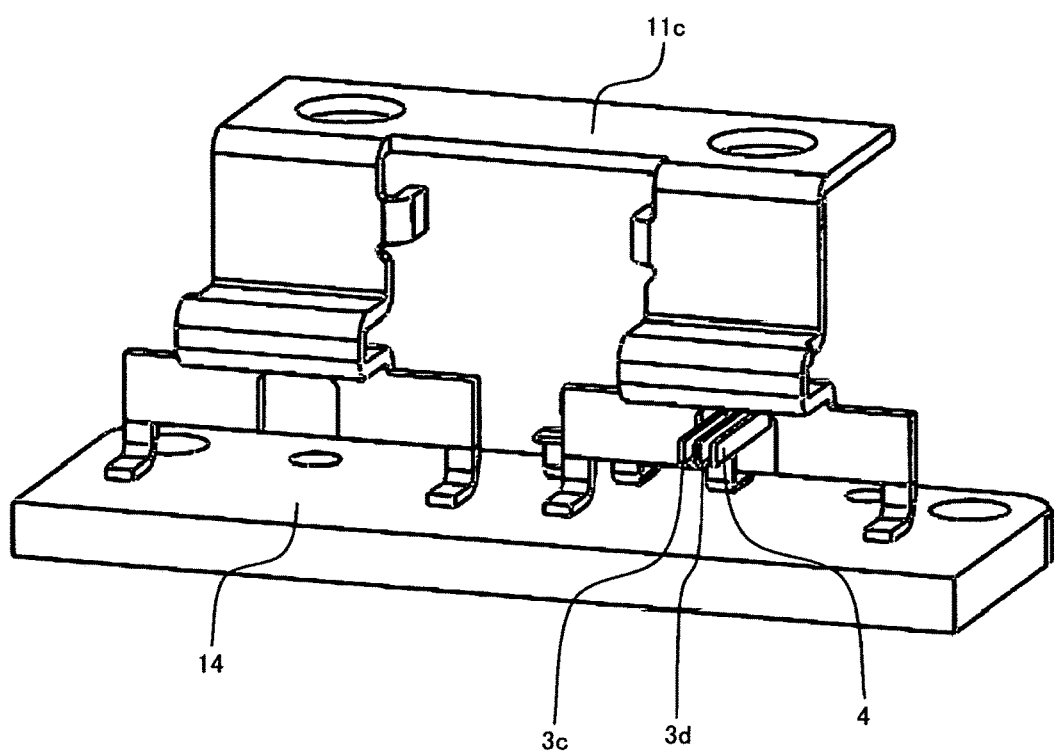
FIG. 9 is a perspective view illustrating a main terminal and control terminals in a section taken along line C-C' of FIG. 8.
Figure 10:
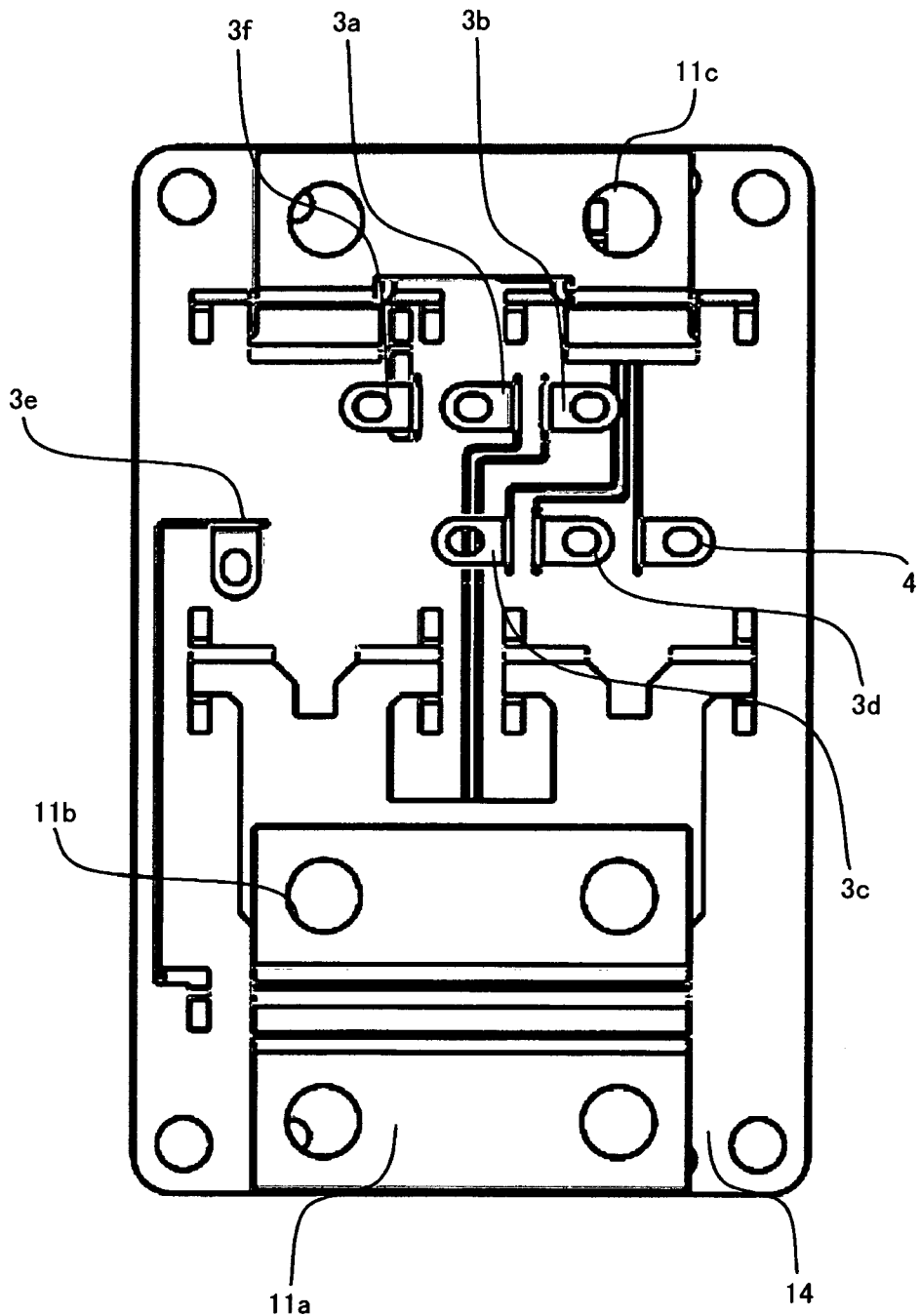
FIG. 10 is a top view of the case internal structure in FIG. 8 as viewed squarely from above.

FIG. 9 shows a main terminal and control terminals in a section taken along line C-C' of FIG. 8 and FIG. 10 is a top view of the terminals and base in FIG. 8. Even when this arrangement is adopted, the relation between the directions of currents and magnetic fluxes shown in FIG. 5 is unchanged. The same effect, that is, the effect that the influence of noise produced by a large current on a main terminal is minimized, is obtained. When layout for the control terminals 3 and wiring are easy, the layout described in relation to this example may be adopted.

Example 3

Figure 11:
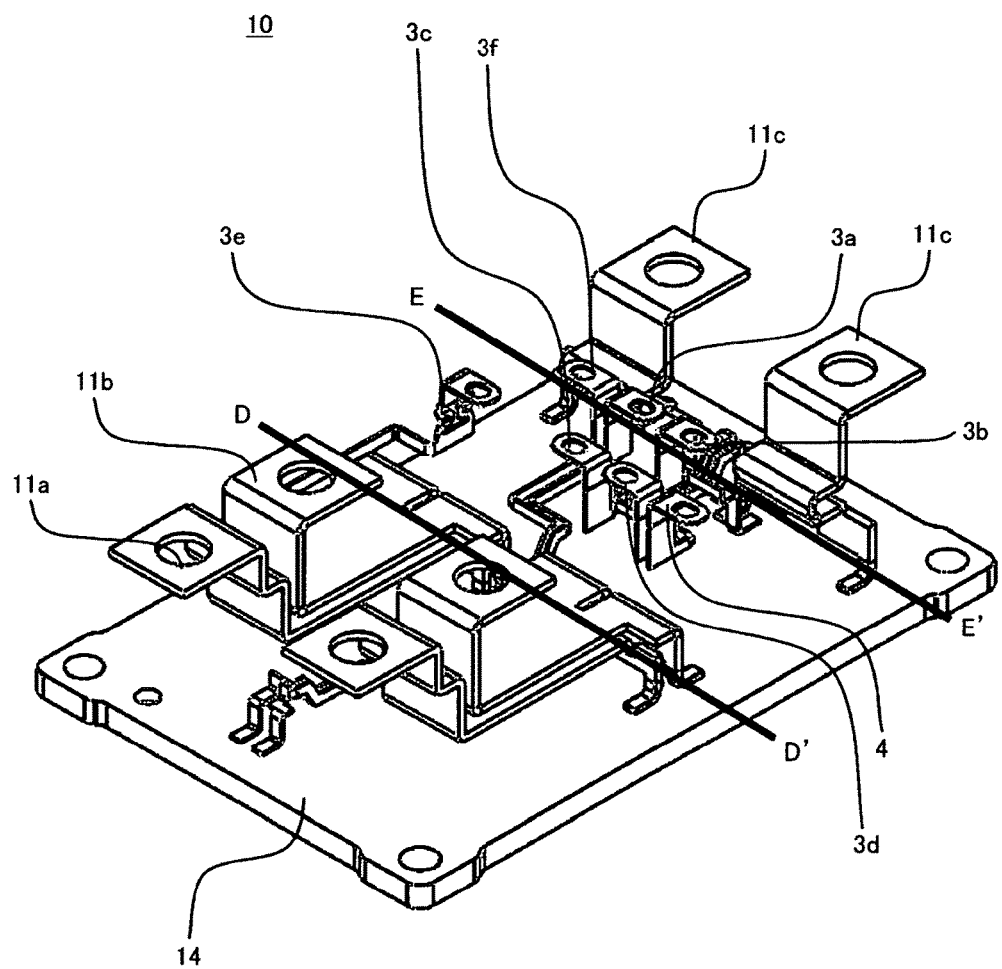
FIG. 11 is a perspective view illustrating the case internal structure of a semiconductor power module in Example 3 of a third embodiment of the present invention (with main terminals divided into multiple pieces)

FIG. 11 is a perspective view illustrating the case internal structure of a semiconductor power module in Example 3 of a third embodiment of the present invention. This example is a modification to Example 1 and identical with Example 1 except that: in this example the main terminals are divided into multiple pieces and thus the layout of the main terminals and the control terminals is different from the layout in Example 1. That is, FIG. 11 illustrates an embodiment in which the main terminals in FIGS. 1 to 6 are not bifurcated but divided into multiple pieces.

The semiconductor power module 10 in this example is so configured that the following is implemented: any one of the main terminals (positive electrode terminal 11*a*, negative electrode terminal 11*b*, alternating current terminal 11*c*) includes two parts extended in a common direction and the control terminals (gate signal terminal 3*a*(3*c*), emitter signal terminal 3*b*(3*d*)) are so placed that their laminated portion is sandwiched between one and the other of the two parts. Especially, the "two parts" are formed of two different components and one and the other of the "two parts" are extended in a common direction.

Figure 12:
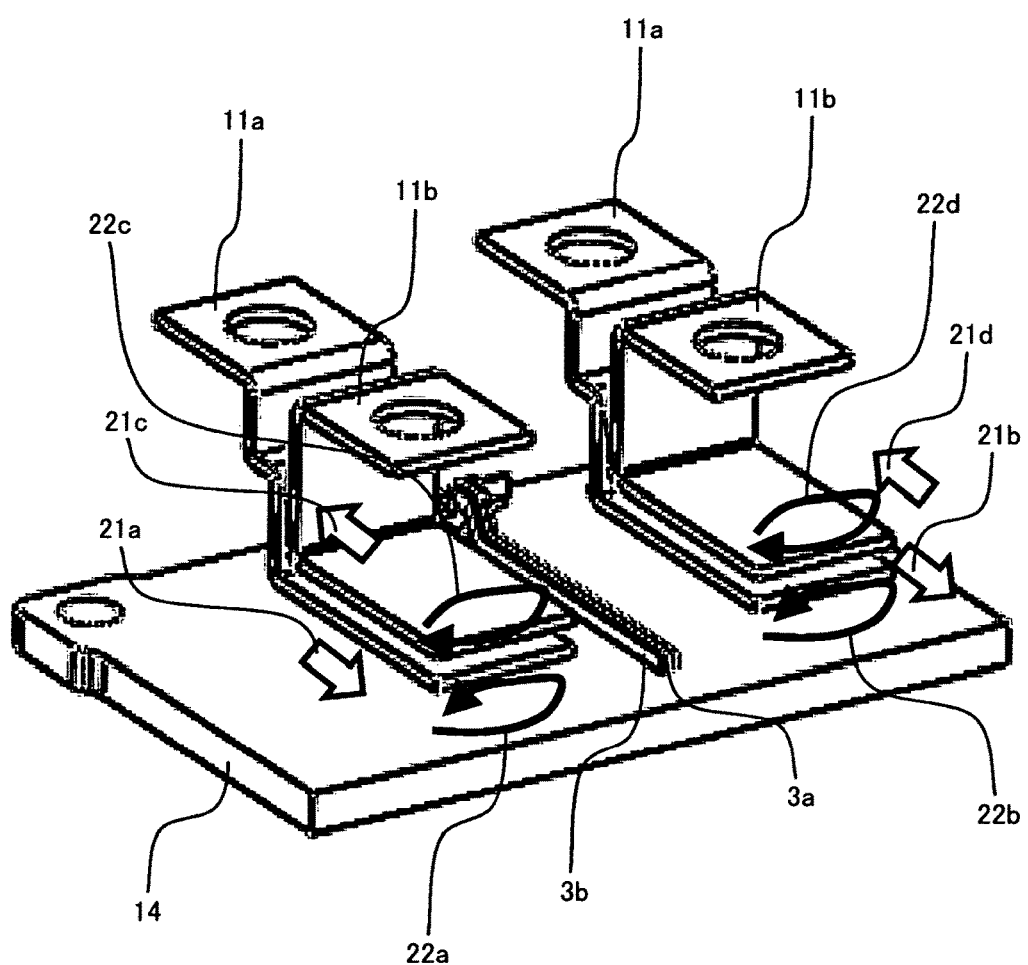
FIG. 12 is a perspective view illustrating main terminals and control terminals in a section taken along line D-D' of FIG. 11.
Figure 13:
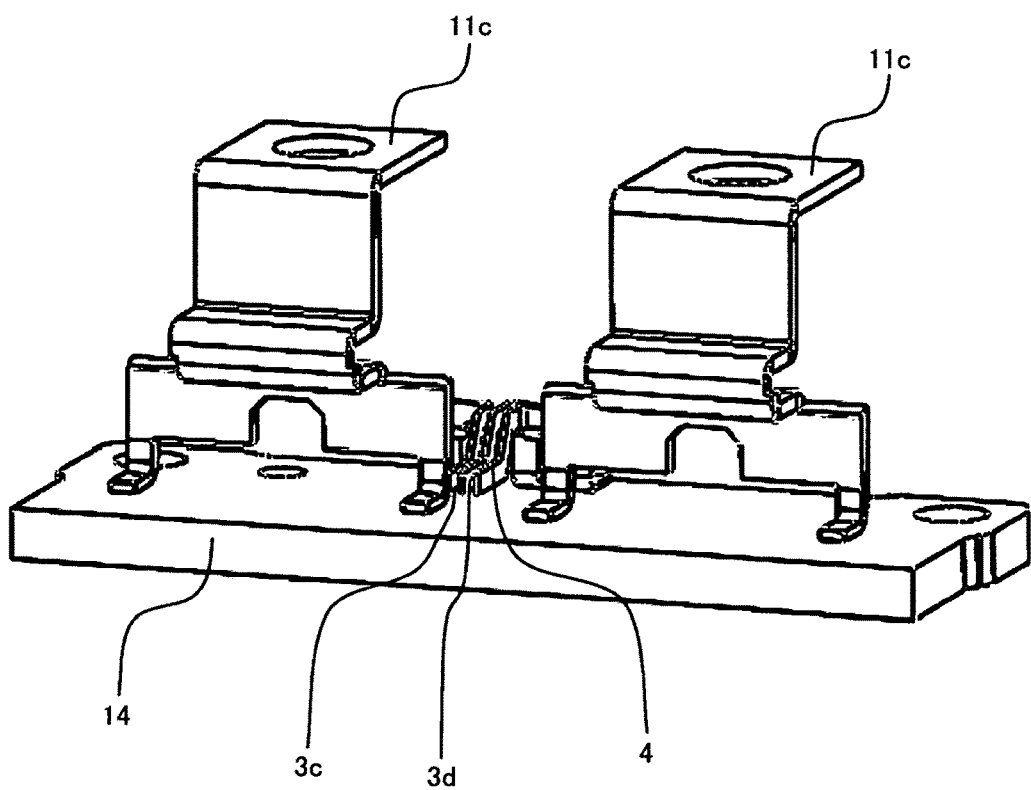
FIG. 13 is a perspective view illustrating a main terminal and control terminals in a section taken along line E-E' of FIG. 11.
Figure 14:
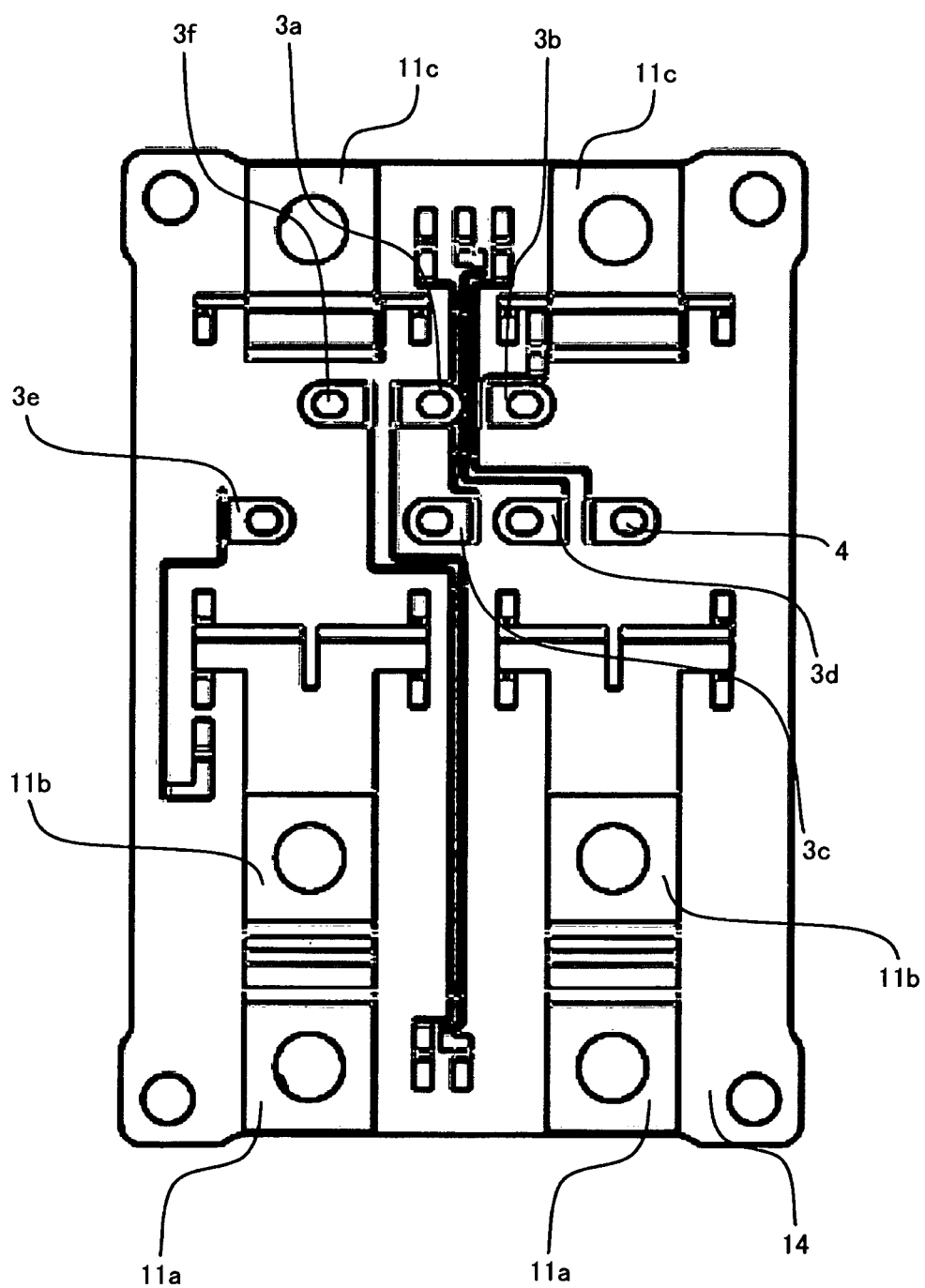
FIG. 14 is a top view of the case internal structure in FIG. 11 as viewed squarely from above.
Figure 15:
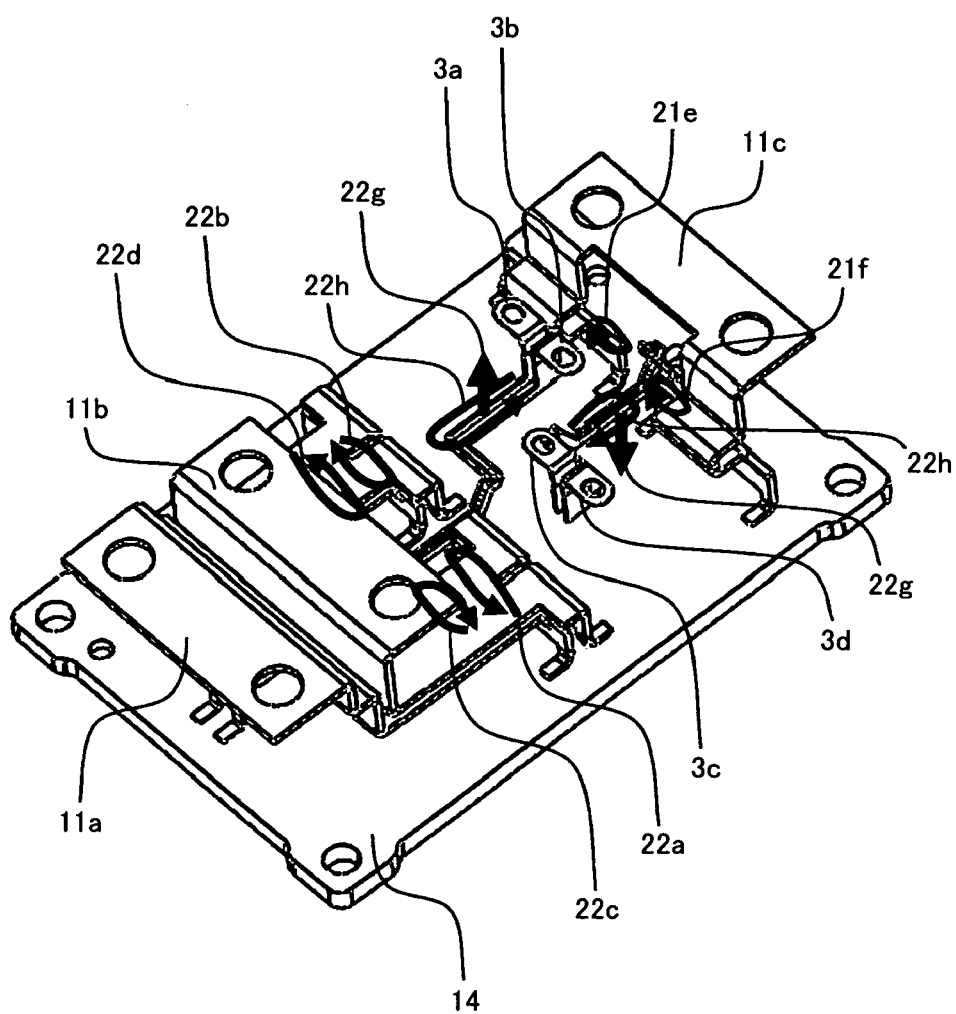
FIG. 15 is a perspective view illustrating the terminals and the base in FIG. 11.

FIG. 12 shows main terminals and control terminals in a section taken along line D-D' of FIG. 11; FIG. 13 shows a main terminal and control terminals in a section taken along line E-E' of FIG. 11; and FIG. 14 shows a top view of the terminals and base in FIG. 11. Even when this arrangement is adopted, the relation between the directions of currents and magnetic fluxes shown in FIG. 5 is unchanged. The same effect, that is, the effect that the influence of noise produced by a large current on a main terminal is minimized, is obtained. This example in which the main terminals are divided into multiple pieces brings about the effect that layout is facilitated. Even when a power module in any other shape is designed, the main terminals can be shared.

Example 4

FIG. 16 shows an example of the circuit block configuration of a power conversion apparatus in Example 4 of the present invention and illustrates an example of application to an electric railroad vehicle. The power conversion apparatus in this example is mounted with, for example, a semiconductor power module in any of Examples 1 to 3 of the present invention. As shown in FIG. 16, the power conversion apparatus 100 constitutes an inverter circuit and is connected between an overhead contact line 300 and a grounding portion 400 of a rail, a carbody, or the like through a transformer 200. Alternating-current power is supplied from this power conversion apparatus 100 to an induction motor 500. One motor 500 is connected to each of four axles provided in each vehicle (equivalent to four sets each of which consists of two wheels, left and right, and one axle securing the wheels together). When the power of the overhead contact line 300 is alternating-current, a converter module for converting an alternating current into a direct current is connected to the power conversion apparatus 100 together with a transformer 200. When the power of the overhead contact line 300 is direct-current, a chopper circuit is substituted for the transformer 200 and the voltage level is adjusted as required.

The power conversion apparatus 100 includes: an inverter module 110 for generating an alternating current of a predetermined frequency from a direct current; a capacitor module 120 for stabilizing and leveling a supplied direct current; a driver circuit 130 which drives and controls the inverter module 110; and a control circuit 140 which supplies a control signal to the driver circuit 130.

In the inverter module 110, each of upper and lower arm series circuits 1*a*, 1*b*, and 1*c* is formed by series-connecting two current switch circuits each composed of a parallel connection circuit of IGBT 2*a* and a diode 2*b*. The upper and lower ends of the upper and lower arm series circuits 1 are respectively connected to a positive electrode and a negative electrode of the capacitor module 120. The current switch circuit composed of the IGBT 2*a* and the diode 2*b* placed on the upper side (positive electrode terminal 11a) operates as a so-called upper arm. The current switch circuit composed of the IGBT 2c and the diode 2d placed on the lower side (negative electrode terminal 11b) operates as a so-called lower arm. The inverter module 110 is formed of a so-called three-phase bridge circuit provided with three sets of the upper and lower arm series circuits 1 mentioned above. A three-phase alternating current (U, V, W) is outputted from the midpoint position of each upper and lower arm series circuit 1. That is, a three-phase alternating current is outputted from the joint (alternating current terminal 11c) between the upper and lower current switch circuits. The outputted three-phase alternating current (U, V, W) is supplied to the motors 500.

An upper arm gate signal 3a outputted from the driver circuit 130 is supplied to the upper arm IGBT 2a in each phase and a lower arm gate signal 3c is supplied to the lower arm IGBT 2c in each phase. The amplitude, phase, and the like of an alternating current (U, V, W) are thereby controlled. The upper arm emitter signal 3b supplied to the driver circuit 130 is sent from the emitter side of the upper arm IGBT 2a in each phase and the lower arm emitter signal 3d is sent from the emitter side of the lower arm IGBT 2c in each phase.

The control circuit 140 includes a microcomputer for executing arithmetic processing with respect to the switching timing of each IGBT 2a. As mentioned above, the emitter electrode of each arm IGBT (2a, 2c) is connected to the driver circuit 130. The driver circuit 130 detects an overcurrent in the emitter electrode for each of the IGBTs and stops the switching operation of any IGBT (2a, 2c) at which an overcurrent is detected to protect the IGBT from the overcurrent. The control circuit 140 is inputted with signals from the following members: a temperature sensor, not shown, provided in the upper and lower arm series circuits 1, a detection circuit which detects direct-current voltage applied across each upper and lower arm series circuit 1, and the like. Based on these signals, the control circuit 140 detects anomalies such as overtemperature and overvoltage. When any anomaly such as overtemperature or overvoltage is detected, the control circuit 140 stops the switching operations of all the IGBTs to protect the upper and lower arm series circuits 1 from anomalies such as overcurrent, overvoltage, and overtemperature.

In the power conversion apparatus 100 described above, the current switch circuits composed of IGBTs (2a, 2c) and diodes (2b, 2d) may be formed using MOSFET (Metal-Oxide Semiconductor Field-Effect Transistor). The inverter module 110 illustrated in FIG. 16 is formed by arranging three 2-in-1 modules constituting the upper and lower arm series circuits 1 in parallel. Instead, one 6-in-1 module may be substituted for the three 2-in-1 modules. When a required output current is larger than a permissible output current per module, the number of modules may be increased and the modules may be connected in parallel. The power conversion apparatus 100 may be provided with a function of charging a battery in addition to the circuitry illustrated in FIG. 16.

As described up to this point, according to each example of the present invention, various advantages are brought about. Control terminals (emitter signal terminal and gate signal terminal) are so placed as to be sandwiched between bifurcated main terminals. As a result, dense packaging is facilitated and module size reduction can be achieved. Magnetic fluxes produced by the bifurcated main terminals are canceled out and minimized in the center of the bifurcation; therefore, removal of noise from a main terminal to a control terminal can also be achieved at the same time as dense packaging. In addition, an emitter signal terminal and a gate signal terminal are laminated in a direction perpendicular to a module base. This makes it possible to make the following directions orthogonal to each other: the direction of a magnetic flux produced by a perpendicularly bifurcated main terminal and the direction of a magnetic flux penetrating a signal wire loop. The influence of noise is consequently minimized. As a result, troubles of malfunction at the time of turn-on or turn-off are suppressed.

The invention claimed is:

1. A semiconductor power module comprising:
   a positive electrode terminal;
   a negative electrode terminal;
   an alternating current terminal;
   an emitter signal terminal;
   a gate signal terminal; and
   a base on which the positive electrode terminal, the negative electrode terminal, the alternating current terminal, the emitter signal terminal, and the gate signal terminal are mounted,
   wherein at least any one of the positive electrode terminal, the negative electrode terminal, and the alternating current terminal includes two parts extending toward an interior portion of the semiconductor power module in a common direction,
   wherein the emitter signal terminal and the gate signal terminal include a adjacently parallel portions formed by respective parts of the emitter signal terminal and the gate signal terminal at said interior portion of the semiconductor power module so as to conduct parallel currents in the adjacently parallel portions, and
   wherein the emitter signal terminal and the gate signal terminal extend along a plane of the base at said interior portion of the semiconductor power module and the adjacently parallel portions are so placed as to be sandwiched between the two parts of at least any one of the positive electrode terminal, the negative electrode terminal, and the alternating current terminal at said interior portion of the semiconductor power module.

2. The semiconductor power module according to claim 1, wherein the two parts are respectively formed of two different components.

3. The semiconductor power module according to claim 2, wherein the alternating current terminal is disposed on an end opposite an end where the positive electrode terminal and the negative electrode terminal are disposed.

4. The semiconductor power module according to claim 3, wherein a control terminal is disposed between an area where the positive electrode terminal and the negative electrode terminal are disposed and an area where the alternating current terminal is disposed.

5. The semiconductor power module according to claim 3, wherein the base, the gate signal terminal, and the emitter signal terminal are so arranged that the plane of the base and planes of the gate signal terminal and the emitter signal terminal in the adjacently parallel portions are orthogonal to each other.

6. The semiconductor power module according to claim 3, wherein an insulator is disposed in at least either of between the positive electrode terminal and the negative electrode terminal in the adjacently parallel portions and between the emitter signal terminal and the gate signal terminal.

7. A power conversion apparatus comprising:
   a plurality of semiconductor power modules having a substantially rectangular shape arranged in parallel such that long sides of the plurality of semiconductor power modules are adjacent,
wherein each said semiconductor power modules are semiconductor power module comprises:
a positive electrode terminal;
a negative electrode terminal;
an alternating current terminal;
an emitter signal terminal;
a gate signal terminal; and
a base on which the positive electrode terminal, the negative electrode terminal, the alternating current terminal, the emitter signal terminal, and the gate signal terminal are mounted,
wherein at least any one of the positive electrode terminal, the negative electrode terminal, and the alternating current terminal includes two parts extending toward an interior portion of the semiconductor power module in a common direction,
wherein the emitter signal terminal and the gate signal terminal include a adjacently parallel portions formed by respective parts of the emitter signal terminal and the gate signal terminal at said interior portion of the semiconductor power module so as to conduct parallel currents in the adjacently parallel portions, and
wherein the emitter signal terminal and the gate signal terminal extend along a plane of the base at said interior portion of the semiconductor power module and the adjacently parallel portions are so placed as to be sandwiched between the two parts of at least any one of the positive electrode terminal, the negative electrode terminal, and the alternating current terminal at said interior portion of the semiconductor power module.

8. The power conversion apparatus according to claim 7,
wherein a capacitor module is is disposed on a side of the positive electrode terminal of each said semiconductor power module, and
wherein a gate wiring circuit board is provided directly over the plurality of semiconductor power modules.

\* \* \* \* \*